(12) United States Patent
Laude et al.

(10) Patent No.: US 6,586,093 B1
(45) Date of Patent: Jul. 1, 2003

(54) NANOSTRUCTURES, THEIR APPLICATIONS AND METHOD FOR MAKING THEM

(75) Inventors: Thomas Laude, Longjumeau (FR); Bernard Jouffrey, Paris (FR); Alain Marraud, Villebon/Yvette (FR)

(73) Assignee: Centre National de la Recherche Scientifique (C.N.R.S.), Paris (FR)

( * ) Notice: Subject to any disclaimer, the term of this patent is extended or adjusted under 35 U.S.C. 154(b) by 0 days.

(21) Appl. No.: 10/111,693

(22) PCT Filed: Oct. 30, 2000

(86) PCT No.: PCT/FR00/03029

§ 371 (c)(1),
(2), (4) Date: Jun. 17, 2000

(87) PCT Pub. No.: WO01/30689

PCT Pub. Date: May 3, 2001

(30) Foreign Application Priority Data

Oct. 28, 1999 (FR) .............................................. 99 13532

(51) Int. Cl.[7] .................................................. D01F 9/12
(52) U.S. Cl. ..................................... 428/364; 423/447.3
(58) Field of Search .......................... 423/447.3, 447.1, 423/447.2; 428/367

(56) References Cited

FOREIGN PATENT DOCUMENTS

| EP | 0 945 884 | 9/1999 |
|---|---|---|
| JP | 10273308 | 10/1998 |

OTHER PUBLICATIONS

Golberg et al, "Nanotubes in Boron Nitride Laser Heated at High Pressure", Applied Physics Letters, US, American Institute of Physics, New York, vol. 69, No. 14, Sep. 30, 1996.

Nasreen et al, "Boron nitride Nanotubes", Science, US, American Association for the Advancement of Science vol. 269, No. 269, pp. 966–967, Aug. 18, 1995.

Loiseau et al, "Boron Nitride Nanotubes", Carbon, US, Elsevier Science Publishing, New York, NY, vol. 36, No. 5–6, pp. 743–752 (1998).

*Primary Examiner*—N. Edwards
(74) *Attorney, Agent, or Firm*—Nixon & Vanderhye, P.C.

(57) ABSTRACT

The invention concerns a method for producing nanostructures under controlled atmosphere, from compounds having a hexagonal crystalline shape, subjected to a focused laser bombardment of a gas. The invention is characterized in that it consists in using a compacted compound sample and in carrying out the process under a residual gas pressure between 1 and $3.10^4$ Pa.

17 Claims, 5 Drawing Sheets

NANOSTRUCTURES, THEIR APPLICATIONS AND METHOD FOR MAKING THEM

The present invention relates to a method for producing nanostructures starting from compounds that are in a hexagonal crystalline shape.

It relates in particular to a method for producing nanobeams, nanofilaments, nanotubes, bundles of nanotubes, twists, nanoribbons, onions, hollow spheres, clusters, compounds of boron nitride either pure or loaded with certain elements.

The invention also relates to the nanostructures obtained by said method.

Structures and nanostructures in the form of fullerenes, hollow nanospheres, or nanotubes of carbon or assemblies of these nanotubes called cords or bundles, are known. These carbon nanostructures are in fact anisotropic forms produced starting from graphite. It will be recalled that carbon nanotubes are in fact one or more graphene sheets rolled up together, with a more or less marked degree of helicity (which can also be zero).

Numerous methods of production have been developed for obtaining carbon nanostructures, such as, in particular the use of an electric arc, the catalytic decomposition of gases, for example hydrocarbons, laser ablation, or laser bombardment of a gas. The method most widely used, on account of its efficiency and the intrinsic properties of graphite (especially its good conductivity) is the electric arc method. As a rule it has to be followed by processes of purification or filtration to obtain nanotubes of a single type.

Since boron nitride has a crystalline structure similar to that of graphite, there have been attempts to obtain nanostructures from this compound. Obviously, the physical and chemical properties of boron nitride are totally different from those of carbon; it should be noted in particular that the melting point of boron nitride is about 1000° C. lower than that of carbon. In addition, it is much more insulating from the electrical standpoint and chemically it is much more ionic than carbon, and less reactive with a certain number of elements. These differences with respect to physicochemical properties between these two elements make the techniques known from the prior art, such as the use of hafnium diboride as the electrode in the electric arc method for example, rather inefficient.

Accordingly, the present invention aims to overcome the drawbacks of the known methods of the prior art, in that it proposes a method for producing nanostructures in large quantity and having, if desired, a high degree of purity.

The method according to the invention for producing nanostructures under a controlled atmosphere, starting from compounds having a hexagonal crystalline shape, subjected to gas laser bombardment, is characterized in that a compacted sample of compound is employed and the operations are carried out at a residual gas pressure between about 5.103 and 8.104 Pa. The vacuum can be dynamic or not.

Other characteristics and advantages of the present invention will become clear from the description given below, referring to the appended drawings which illustrate an example of application thereof, without any limiting character. In the drawings.

Figure 1:
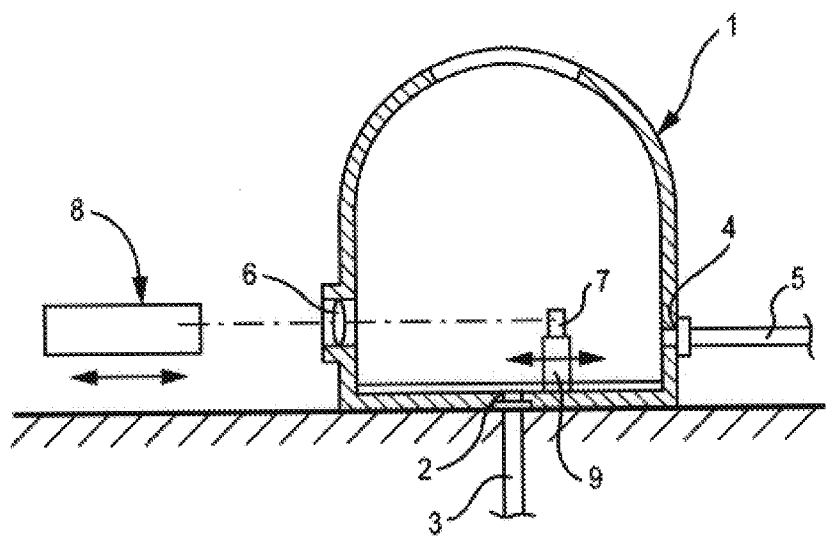
FIG. 1 is a schematic view of various components permitting application of the method of the invention.
Figure 2:
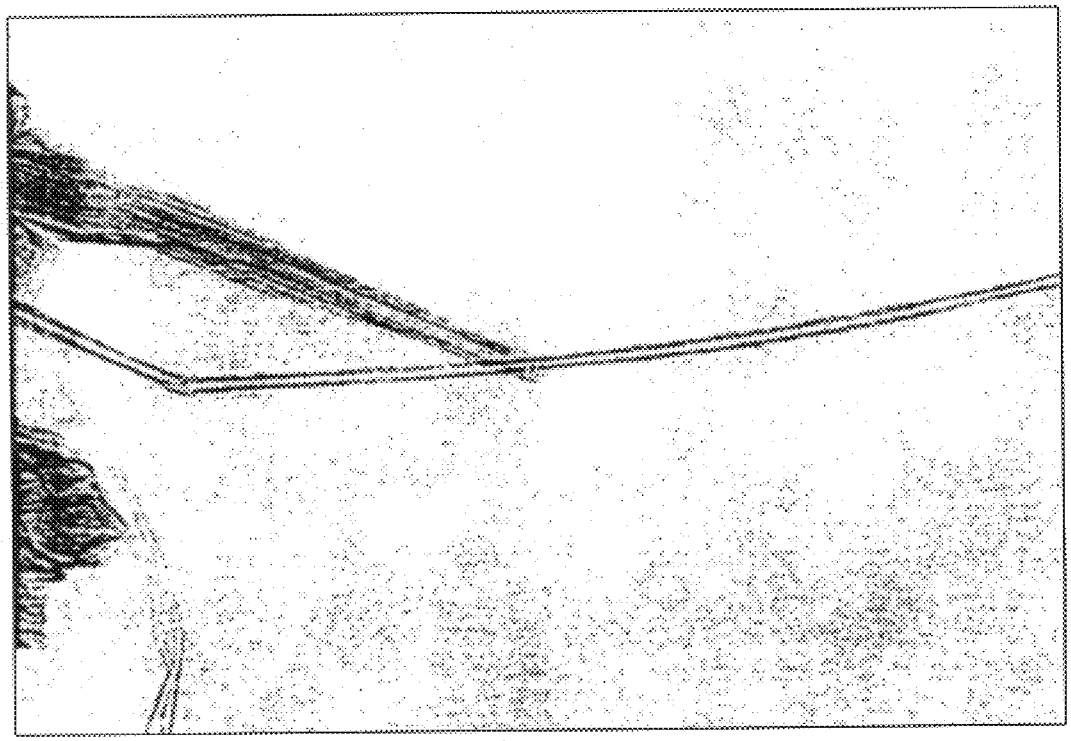
FIGS. 2 to 7 are views obtained by scanning or transmission electron microscopy, showing the geometries of the nanostructures.
Figure 3:
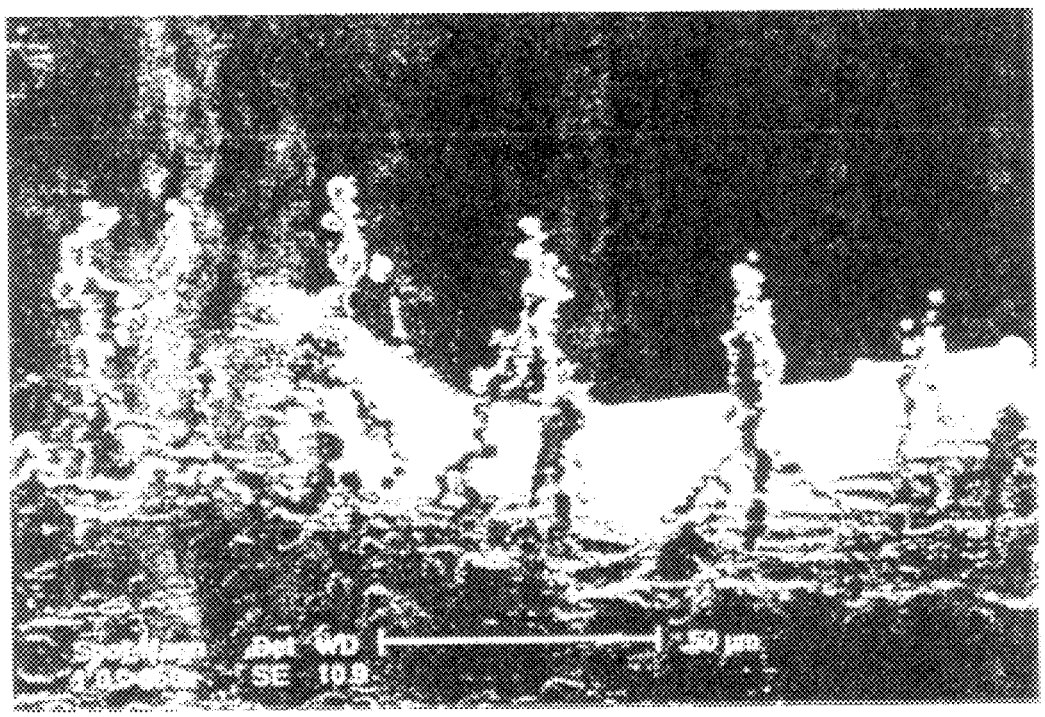
Figure 4:
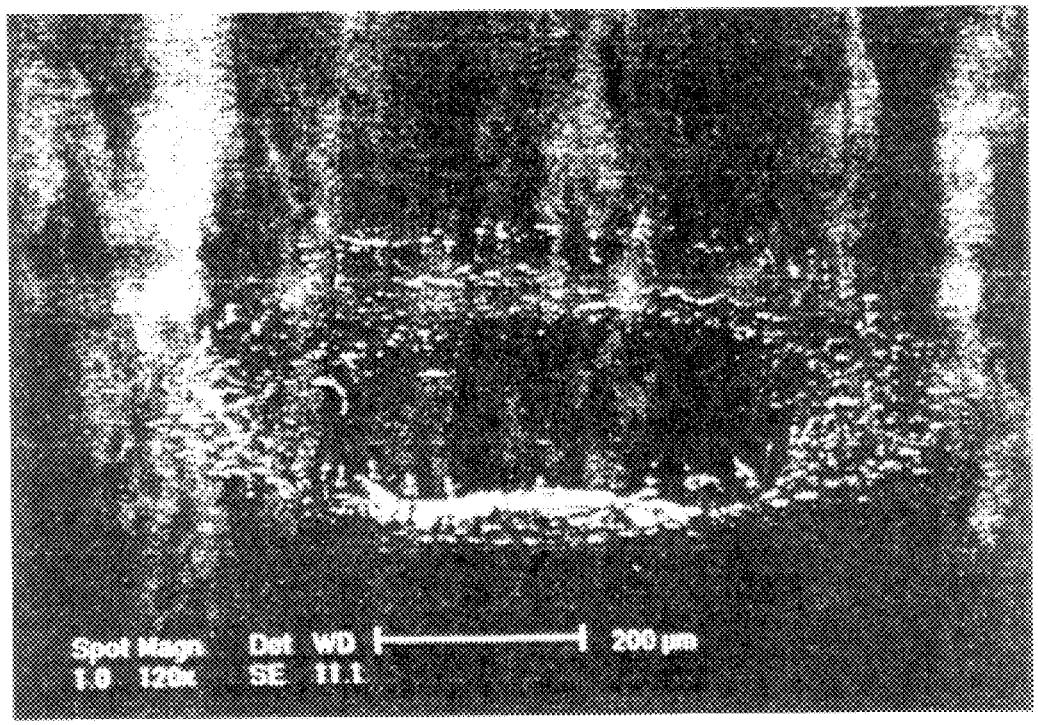
Figure 5:
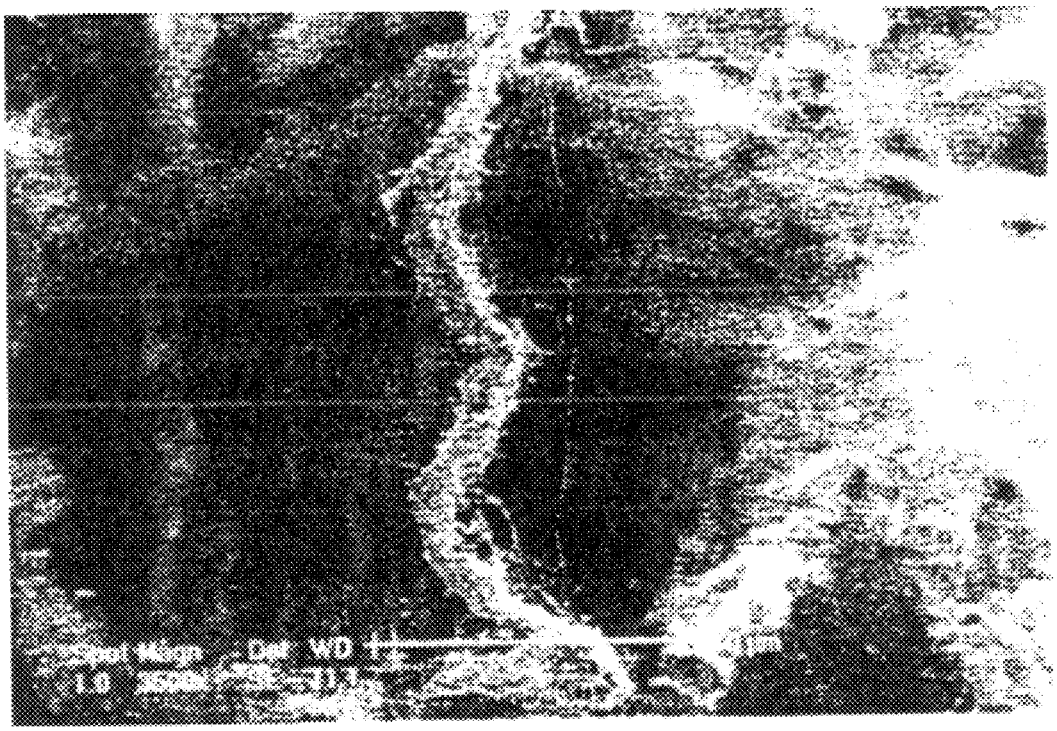

According to one embodiment of the method of the invention, it consists of placing a compound having a crystalline structure of hexagonal shape, for example of zinc, of zirconium, of titanium, of magnesium, of cadmium, of beryllium or of boron nitride, prepared as a compacted sample, within a chamber. As a variant, this method could also be employed for obtaining other materials, optionally in the presence of a catalyst. For example, these may be transition metals such as iron, nickel, cobalt, binary compounds ($WS_2$, $MoS_2$ etc.), lamellar compounds.

The sample used is subjected to a preliminary operation of annealing, for example in the chamber.

Furthermore, the said chamber is made hermetic by known means, and evacuated, then it is filled with a controlled atmosphere, dynamic or not.

Preferably, the sample of compacted-powder compounds is placed inside the said chamber on a support, advantageously made of a material similar to that of the sample.

For example, in the case of a sample of boron nitride powder, the latter will be placed on a support in the form of a bar, also of boron nitride, so as to avoid any chemical reaction between the said support and the said sample.

If the sample of compounds were not presented in a form with an adequate degree of purity, it would then have to undergo a purification stage, which can consist essentially of carrying out sample degassing.

For this purpose, the sample is positioned inside the chamber, then the latter is hermetically sealed relative to the external environment.

The chamber is then connected to a source of vacuum so as to create a pressure of the order of 10–5 mbar (about 1.10–3 Pa), or better if desired.

Next the sample of fritted or compacted compound is subjected to heating by continuous unfocused illumination with a laser beam. The wavelength of the laser radiation is selected according to the type of sample and in fact corresponds to the wavelength that is best absorbed by the sample. Thus, in the case of boron nitride it is possible to use a $CO_2$ laser, whose wavelength is close to 10.6 $\mu$m.

According to another embodiment, the energy required for heating the sample can be supplied from another source (heating by the Joule effect, by induction, by ion bombardment or equivalent, etc.).

If the sample of the compound has a degree of purity quite close to 100%, the degassing stage is not necessarily employed.

Placement of the compacted sample on its support, of the same chemical nature, in the chamber is then proceed with directly. The latter is evacuated and filled with an atmosphere of gas at low pressure.

It should be noted that the surface quality of the heated material has a considerable influence on the yield of products obtained. Thus, with a material in the form of compacted powder, it will be advantageous to employ preheating, for example of the order of one minute to several minutes under vacuum, to increase the quantity of nanostructures.

The residual gas pressure in the chamber will be between 0.5 and 8–104 Pa, or even more depending on the material treated. Thus, for boron nitride, a pressure of 1.104 Pa of nitrogen gives satisfactory results, and an increase in pressure leads to more varied structures, with more clusters and even tree structures.

According to a preferred embodiment, the laser beam passes through an optical device, in particular a lens, enabling said beam to be focused on a precise point in a chamber and especially on a defined zone of the sample.

Thus, the radiation from a $CO_2$ laser, with power of the order of approximately 50 to 80 W, or more depending on the material treated, is focused by means of an optical device so as to obtain an optimum energy density. For higher conditions of power density, compounds with very different structures can be produced, in particular extensive wafers, especially of boron nitride. The power density is of the order of 6 to 8 GW/m2 on a diameter of 100 to 200 μm. The sample is bombarded continuously, in order to raise its temperature to a surface temperature above the dissociation temperature of the said sample. For example, in the case of boron nitride, this temperature-is quite close to 2400° C.

As a variant, it is possible to increase the quantity of material treated by relative movement of the sample or of the laser-beam.

In the first few seconds of heating, a hole, partially filled with fused compounds (in particular of boron), forms on the surface of the sample, under the effect of dissociation.

This method of fabrication and production of nanostructures, in particular in boron nitride, employs the technique similar to laser-assisted chemical vapour phase deposition. The latter is employed to heat the sample locally to a temperature above the dissociation temperature, and the gas contained in the chamber (nitrogen) will then aid nucleation and growth from the sample surface, dissociating, combining with the compound (boron), then accumulating to lead to the formation and growth of nanostructures on the target surface.

The total loss of material is slow enough for the temperature gradient in the sample to remain stable during growth of the structures. The sample is left to cool before opening the chamber to the external environment to avoid any oxidation.

Photographs of the sample surface obtained by technique's of optical microscopy, transmission and/or scanning electron microscopy (SEM), as well as analytical techniques (electron energy loss spectroscopy, EELS) enable us to characterize the various structures obtained.

Figure 6:
Figure 7:
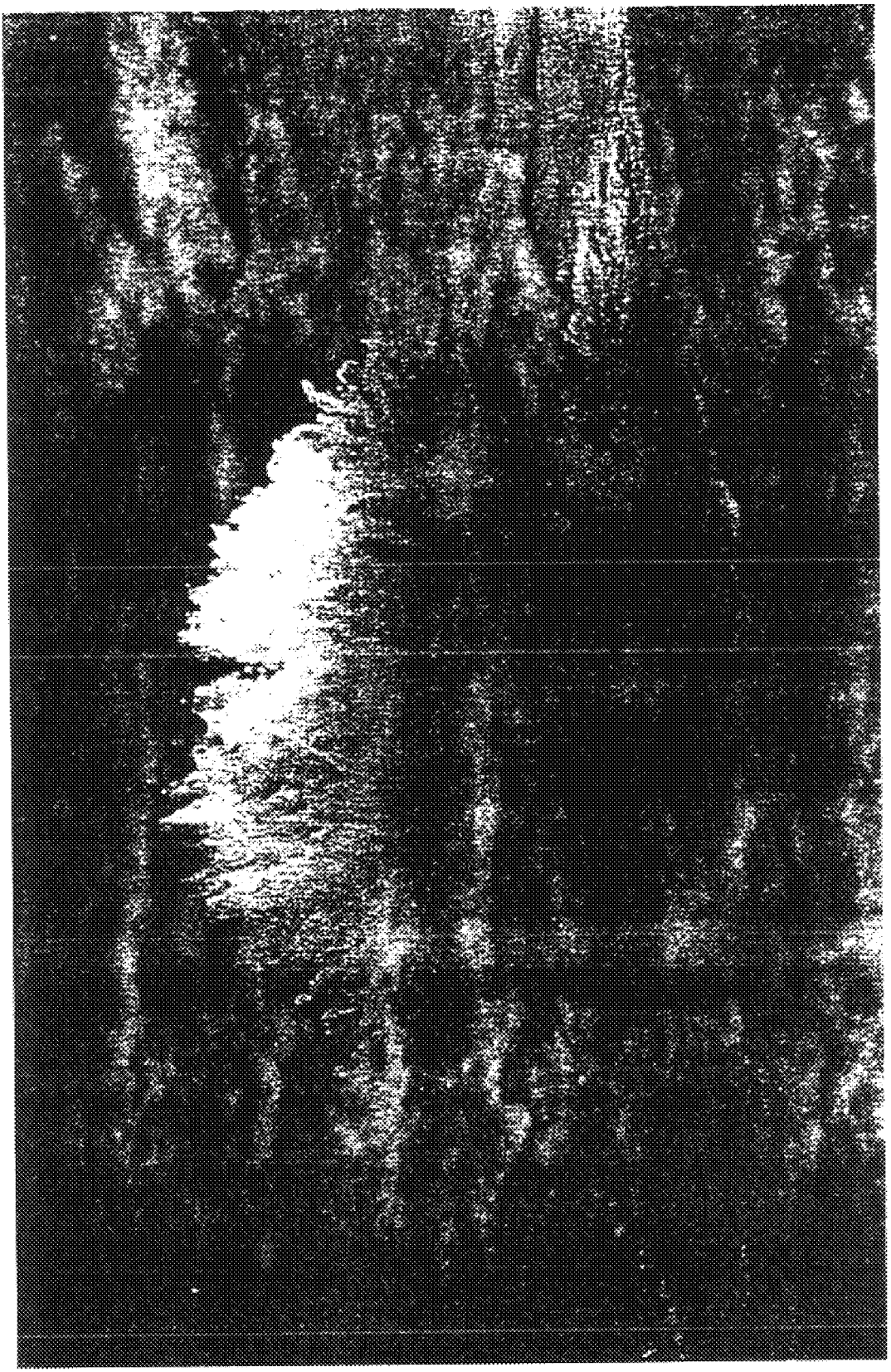

In this way it is possible to obtain nanostructures of boron nitride (cf. FIGS. 2, 3, 4 and 5) consisting of entangled filaments, with a diameter of the order of a nanometre to several tens of nanometres, and with length in the micrometre range (up to several tens of microns). FIG. 6 shows nanoribbons with clusters, and FIG. 7 shows a structure with tree structures. Qualitatively, these boron nitride nanostructures can be pure or they can have impurities or doping elements at various concentrations, such as of carbon in particular, the said impurities or the said doping elements may or may not act as a catalyst, and the said impurities or the said elements are present either in the sample, or in the controlled atmosphere. The said doping can alter the conduction properties of the material.

It is also possible to obtain filaments, cords, ribbons, entanglements, in the shape of nanotubes, nanobeams etc., and having a morphology that is in particular angular, twisted or pseudo-spherical.

Of course, depending on the chemical nature of the nanostructure to be produced, it is necessary to adjust the operating conditions (power of the laser, heating time, nature of the gas constituting the residual pressure in the chamber, etc.) of the method of the invention.

An installation for implementing the method of the invention will now be described. In particular, the installation (cf. FIG. 1) comprises a chamber 1 that can be sealed hermetically relative to the external environment, the said chamber 1 being provided moreover, on the one hand with a first opening 2 connected to a pumping source 3, and on the other hand with a second opening 4 connected to a source of controlled atmosphere 5, the said chamber 1 being further provided with an optical device 6, in particular of the lens type, to permit a laser beam 8 to be made to converge on a sample 7 placed inside the said chamber 1. The laser is preferably a continuous laser of the CO2 type.

Furthermore, a support 9, optionally provided with a scanning movement, for the sample 7, is provided inside the said chamber 1.

The invention as described in the foregoing offers many advantages, since this method can be used in particular for obtaining boron nitride nanostructures that are essentially insulators (hence their interest for example in stealth technology), and more generally in problems of adjustment of electrical conductivity. These nanostructures, which can be in varied conformations (helix, beam, tube, ribbon etc.), can be used for example in the manufacture of composites, possessing very high mechanical strength properties. It should also be noted that the boron nitride nanostructures are extremely chemically inert, even at high temperature, which may in particular make them less reactive with respect to molten metals, and very resistant to oxidation.

The nanostructures of the invention can also be used in field emission if a conducting or semiconducting compound is deposited on top.

Among other applications, we may mention that the twisted forms can serve as supports for other molecules and that the nanotubes can be used as nanocapacitors for detecting very weak charges.

The invention has made it possible to develop a means of annihilating the positive charges that remain under the impact of an electron beam during observation by electron microscopy of the nanostructures of the material, and especially of boron nitride.

Secondary electron emission under the impact of the electron beam then extended, which is employed for the observation, or the use of another electron beam on a conducting part (grid or metal plate), quite close to the object being observed, makes it possible to annihilate the positive charges left on the insulator. In this or similar cases, charge effects can be avoided.

This method will therefore be used in transmission or scanning electron microscopy.

The present invention is not of course limited to the examples of application described and illustrated above, but encompasses all variants.

What is claimed is:

1. A method for producing nanostructures in a controlled atmosphere, starting from compounds having a hexagonal crystalline shape, subjected to focused gas laser bombardment, characterized in that a compacted sample of compound is used and the operations are carried out at a residual gas pressure between about 5.103 and 8.104 Pa.

2. A method according to claim 1, characterized in that the power of the laser beam is approx. 50 to 80 W.

3. A method according to claim 1, characterized in that the sample is annealed beforehand.

4. A method according to claim 1, characterized in that preliminary degassing of the sample of compounds is carried out if the latter contains impurities, by unfocused laser beam bombardment, the sample having first been placed in a hermetically sealed and evacuated chamber.

5. A method according to, characterized in that the sample of compounds is arranged on a support of the same chemical nature as the sample.

6. A method according to claim 1, characterized in that the scanning movement of the sample relative to the laser beam is obtained by movement of the support.

7. A method according to claim 1, characterized in that the scanning movement of the sample relative to the laser beam is obtained by movement of the laser.

8. A method according to claim 1, characterized in that the sample is subjected to the action of a continuous CO2 laser beam.

9. A method according to claim 1, characterized in that it is applied to compounds of boron nitride.

10. A method according to claim 1, characterized in that it is applied to compounds selected in particular from zinc, zirconium, titanium, magnesium, cadmium, beryllium, cobalt, binary compounds, lamellar compounds.

11. A method according to claim 1, characterized in that the local fusion of the sample is sufficient for the temperature gradient in the sample to become stabilized.

12. An installation for implementing the method according to claim 1, characterized in that it comprises a chamber (1) that can be hermetically sealed relative to the external environment, the said chamber (1) being further provided, on the one hand, with a first opening (2) connected to a source of vacuum (3), and on the other hand with a second opening (4) connected to a source of controlled atmosphere (5), the said chamber (1) being equipped in addition with an optical device (6), in particular of the lens type, permitting a laser beam (8) to be made to converge on a sample (7) placed inside the said chamber (1).

13. Nanostructures obtained by application of the method according to claim 1, characterized in that they are in the form of nanofilaments.

14. Nanostructures obtained by application of the method according to claim 1, characterized in that they are in the form of nanotubes or bundles of nanotubes, or as twists.

15. Nanostructures obtained by application of the method according to claim 1, characterized in that they are in the form of ribbons.

16. Nanostructures obtained by application of the method according to claim 1, characterized in that they contain impurities or doping elements at various concentrations, which can act as a catalyst.

17. Application of the nanostructures according to claim 13, as insulators, or for the reinforcement of materials.

\* \* \* \* \*